United States Patent
Luo et al.

(10) Patent No.: US 9,285,427 B2
(45) Date of Patent: Mar. 15, 2016

(54) TESTING APPARATUS AND TESTING METHOD OF ELECTRONIC DEVICE

(71) Applicant: Wistron Corporation, New Taipei (TW)

(72) Inventors: Wen-Hwa Luo, New Taipei (TW);
Kuan-Han Chen, New Taipei (TW);
Chih-Sheng Liao, New Taipei (TW)

(73) Assignee: Wistron Corporation, New Taipei (TW)

( * ) Notice: Subject to any disclaimer, the term of this patent is extended or adjusted under 35 U.S.C. 154(b) by 316 days.

(21) Appl. No.: 14/017,317

(22) Filed: Sep. 4, 2013

(65) Prior Publication Data

US 2014/0164858 A1    Jun. 12, 2014

(30) Foreign Application Priority Data

Dec. 6, 2012   (TW) .................................. 101145830

(51) Int. Cl.
*G01R 31/28*    (2006.01)
*G01R 31/00*    (2006.01)
(Continued)

(52) U.S. Cl.
CPC ........ *G01R 31/318536* (2013.01); *G01R 31/02* (2013.01); *G01R 31/026* (2013.01);
(Continued)

(58) Field of Classification Search
CPC .... G01R 31/02; G01R 31/026; G01R 31/043; G01R 31/046; G01R 31/27; G01R 21/2801; G01R 31/2805; G01R 31/2806; G01R 31/2808; G01R 31/2886; G01R 31/2887; G01R 31/318536; G01R 1/0408; G01R 1/0433; G01R 1/0483; G01R 1/07328
USPC .......... 324/500, 537, 756.01, 756.02, 756.07, 324/763.01
See application file for complete search history.

(56) References Cited

U.S. PATENT DOCUMENTS 5,521,513 A * 5/1996 Stringer ............. G01R 31/2834
324/527
6,154,863 A * 11/2000 Prokopp ............ G01R 1/07328
324/754.03
(Continued)

FOREIGN PATENT DOCUMENTS

CN         1667427         9/2005
CN        101685135        5/2012
(Continued)

OTHER PUBLICATIONS

"Office Action of Taiwan Counterpart Application", issued on Apr. 23, 2014, p. 1-p. 11, in which the listed references were cited.
(Continued)

*Primary Examiner* — Hoai-An D Nguyen
(74) *Attorney, Agent, or Firm* — Jianq Chyun IP Office

(57) ABSTRACT

A testing apparatus and a testing method of an electronic device are provided. The testing apparatus includes at least two device transfer plates and a testing circuit. The device transfer plates are electrically and respectively connected to corresponding electronic devices and at least two sockets corresponding to the electronic devices. The testing circuit is electrically connected to the device transfer plates respectively through at least two sets of serial signal wire pairs. According to types of the electronic devices, the testing circuit provides a serial signal to one of the device transfer plates through the corresponding serial signal wire pair and receives a response from another one of the device transfer plates through the corresponding serial signal wire pair, so as to test whether an open circuit is occurred to a bus between the electronic devices respectively corresponding to the device transfer plates.

22 Claims, 12 Drawing Sheets

(51) Int. Cl.
*G01R 31/3185* (2006.01)
*G01R 31/02* (2006.01)
*G01R 31/04* (2006.01)
*G01R 1/073* (2006.01)

(52) U.S. Cl.
CPC ........ *G01R31/2806* (2013.01); *G01R 31/2886* (2013.01); *G01R 1/07328* (2013.01); *G01R 31/046* (2013.01)

(56) References Cited

U.S. PATENT DOCUMENTS

| | | | | |
|---|---|---|---|---|
| 6,167,542 | A | * 12/2000 | Chakraborty | .. G01R 31/318307 714/720 |
| 7,855,571 | B2 | * 12/2010 | Teng | ................ G01R 31/2889 324/756.02 |
| 2003/0146763 | A1 | * 8/2003 | Sunter | ............. G01R 31/31855 324/527 |
| 2006/0117232 | A1 | 6/2006 | Warren et al. | |
| 2008/0021695 | A1 | * 1/2008 | Wang | .................... G06F 11/261 703/24 |
| 2008/0211529 | A1 | 9/2008 | Chen et al. | |
| 2009/0140746 | A1 | 6/2009 | Teng et al. | |

FOREIGN PATENT DOCUMENTS

| | | |
|---|---|---|
| TW | 200807301 | 2/2008 |
| TW | M332194 | 5/2008 |
| TW | 201044163 | 12/2010 |

OTHER PUBLICATIONS

"Office Action of China Counterpart Application" with partial English translation, issued on Dec. 15, 2015, p1-p25, in which the listed references were cited.

\* cited by examiner

TESTING APPARATUS AND TESTING METHOD OF ELECTRONIC DEVICE

CROSS-REFERENCE TO RELATED APPLICATION

This application claims the priority benefit of Taiwan application serial no. 101145830, filed on Dec. 6, 2012. The entirety of the above-mentioned patent application is hereby incorporated by reference herein and made a part of this specification.

BACKGROUND OF THE INVENTION

1. Field of the Invention

The invention relates to a testing apparatus and a testing method of an electronic device. More particularly, the invention relates to a testing apparatus and a testing method of an electronic device for testing whether an open circuit is occurred to a bus between the electronic devices.

2. Description of Related Art

With the development of technologies and the progress of manufacturing processes, the performance of a central processing unit (CPU) has been boosted, and thus the types of electronic devices that may be supported by the CPUs become diverse and complicated. In order to ensure normal data transmission through the bus between the CPU and different types of electronic devices, the signal transmission between the CPU and other electronic devices is often tested by means of a testing apparatus.

When the signal transmission is tested with use of a conventional testing apparatus, an inspector needs to connect each pin of the bus between the to-be-tested electronic devices to a testing fixture through a wire and execute a testing program to control the manner in which the testing fixture outputs a testing signal, so as to test whether the open circuit is occurred to each transmission channel in the bus. However, when the number of the pins in the to-be-tested bus is significant, the testing process becomes complex, and errors are prone to occur in the testing process. For instance, errors are very much likely to arise from the inspection of the signal transmission through a quad peripheral interface (QPI) bus between normal CPUs because the inspector is required to sequentially connect 84 two-way transmission pins of the QPI bus to the testing fixture.

In addition, the testing fixture in the conventional testing apparatus often relies on indicator light that shows whether an open circuit is occurred to the corresponding transmission channel, and thus the inspector is required to look up the corresponding data to correctly determine the testing result of the bus. Hence, some degrees of human negligence may be involved, and thereby the testing result may be erroneous.

SUMMARY OF THE INVENTION

The invention is directed to a testing apparatus and a testing method of an electronic device. Specifically, a serial signal is generated by a serial signal wire pair constituted by two signal wires for testing the electronic device.

In an embodiment of the invention, a testing apparatus configured to test a bus between at least two electronic devices on a circuit board is provided. The circuit board includes at least two sockets, and the electronic devices are configured to electrically connect the corresponding sockets on the circuit board, respectively. The testing apparatus includes at least two device transfer plates and a testing circuit. The device transfer plates are electrically connected to the corresponding electronic devices and electrically connected to the sockets corresponding to the electronic devices. The testing circuit is electrically connected to the device transfer plates respectively through at least two sets of serial signal wire pairs. Here, according to types of the electronic devices, the testing circuit provides a serial signal to one of the device transfer plates through the corresponding serial signal wire pair and receives a response from another one of the device transfer plates through the corresponding serial signal wire pair, so as to test whether an open circuit is occurred to the bus between the electronic devices respectively corresponding to the device transfer plates.

According to an embodiment of the invention, the electronic devices include at least two first electronic devices, a signal is transmitted between the first electronic devices through a corresponding first bus having a plurality of transmission channels. The testing circuit provides the serial signal to the one of the device transfer plates, such that the another one of the device transfer plates responds to a signal transmission state of the corresponding first bus and outputs a testing result signal to the testing circuit through the corresponding serial signal wire pair. According to the testing result signal, the testing circuit determines whether the open circuit is occurred to each of the transmission channels of the corresponding first bus.

According to an embodiment of the invention, the testing circuit further determines whether a short circuit is occurred between adjacent transmission channels of the transmission channels of the corresponding first bus according to the testing result signal.

According to an embodiment of the invention, the electronic devices includes a first electronic device and at least one second electronic device, and a signal is transmitted between the first electronic device and the at least one second electronic device through a corresponding second bus having a plurality of transmission channels. The testing circuit provides the serial signal to the device transfer plate corresponding to the first electronic device, such that the device transfer plate corresponding to the at least one second electronic device responds to a signal transmission state of the corresponding second bus and outputs a testing result signal to the testing circuit through the corresponding serial signal wire pair. According to the testing result signal, the testing circuit determines whether the open circuit is occurred to each of the transmission channels of the corresponding second bus.

According to an embodiment of the invention, the electronic devices includes a first electronic device and at least one third electronic device, and a signal is transmitted between the first electronic device and the at least one third electronic device through a corresponding third bus having a plurality of transmission channels. The testing circuit provides the serial signal to the device transfer plates corresponding to the first electronic device, such that the device transfer plates corresponding to the at least one third electronic device responds to a signal transmission state of the corresponding third bus and outputs a testing result signal to the testing circuit through the corresponding serial signal wire pair. According to the testing result signal, the testing circuit determines whether the open circuit is occurred to each of the transmission channels of the corresponding third bus.

According to an embodiment of the invention, the testing circuit serial includes at least two first serial connectors, a processing unit, and a display module. The processing unit is electrically connected to the first serial connectors for generating the serial signal according to the types of the electronic devices, so as to control signal transmission and signal reception of the device transfer plates. The display module is electrically connected to the processing unit for displaying a testing result of the electronic devices.

According to an embodiment of the invention, each of the device transfer plates has an identification code, and the processing unit reads the identification codes to determine the types and a testing order of the electronic devices to be tested, and thereby the processing unit provides the corresponding serial signal and decides the testing order.

According to an embodiment of the invention, each of the device transfer plates includes a second serial connector, a first control module, a transmission module, and a reception module. The second serial connectors of the device transfer plates are electrically connected to the corresponding first serial connectors through the corresponding serial signal wire pairs, respectively. The first control module is electrically connected to the second serial connector to receive the serial signal. The transmission module is electrically connected to the first control module and controlled by the first control module to provide a testing signal, such that the corresponding electronic device transmits the testing signal through the corresponding bus. The reception module is electrically connected to the first control module, receives the testing signal transmitted through the corresponding bus, and transmits the testing signal back to the first control module, such that the first control module generates a testing result signal.

According to an embodiment of the invention, the testing signal is a pulse signal, and the first control module sets a frequency and a pulse number of the testing signal according to the serial signal.

According to an embodiment of the invention, the reception module calculates the pulse number of the received testing signal and transmits a calculation result back to the first control module, and the first control module compares the calculation result with the pulse number of the testing signal provided by the corresponding device transfer plate to generate the testing result signal.

According to an embodiment of the invention, the testing circuit further includes a protocol analyzing module. The protocol analyzing module is electrically connected to the first serial connectors and the processing unit for analyzing a signal output and received by the corresponding bus and transmitting an analysis result back to the processing unit.

According to an embodiment of the invention, each of the device transfer plates further includes a second control module. The second control module is electrically connected to the transmission module, the reception module, and the second serial connector for obtaining the signal output and received by the corresponding bus and transmitting the signal to the protocol analyzing module through the second serial connector.

In an embodiment of the invention, a testing method of an electronic device for testing a bus between at least two electronic devices on a circuit board is provided. The circuit board includes at least two sockets, and the electronic devices are configured to electrically connect the corresponding sockets on the circuit board, respectively. The testing method includes: electrically connecting at least two device transfer plates to the electronic devices corresponding to the device transfer plates and electrically connecting the device transfer plates to the sockets corresponding to the electronic devices, respectively; electrically connecting the device transfer plates to at least two serial signal wire pairs; providing a serial signal to one of the device transfer plates through the corresponding serial signal wire pair and receiving a response from another one of the device transfer plates through the corresponding serial signal wire pair according to types of the electronic devices, so as to test whether an open circuit is occurred to the bus between the electronic devices respectively corresponding to the device transfer plates.

According to an embodiment of the invention, the electronic devices include at least two first electronic devices, a signal is transmitted between the first electronic devices through a corresponding first bus having a plurality of transmission channels. Here, the step of testing whether the open circuit is occurred to the bus between the electronic devices respectively corresponding to the device transfer plates includes: providing the serial signal to the one of the device transfer plates; receiving a testing result signal from the another one of the device transfer plates through the corresponding serial signal wire pair, wherein the testing result signal is associated with a signal transmission state of the corresponding first bus; determining whether the open circuit is occurred to each of the transmission channels of the corresponding first bus according to the testing result signal.

According to an embodiment of the invention, the step of testing whether the open circuit is occurred to the bus between the electronic devices respectively corresponding to the device transfer plates further includes: determining whether a short is occurred between adjacent transmission channels of the transmission channels of the corresponding first bus according to the testing result signal.

According to an embodiment of the invention, the electronic devices include a first electronic device and at least one second electronic device, and a signal is transmitted between the first electronic device and the at least one second electronic device through a corresponding second bus having a plurality of transmission channels. The step of testing whether the open circuit is occurred to the bus between the electronic devices respectively corresponding to the device transfer plates includes: providing the serial signal to the device transfer plates corresponding to the first electronic device; receiving a testing result signal from the device transfer plate corresponding to the at least one second electronic device through the corresponding serial signal wire pair, wherein the testing result signal is associated with a signal transmission state of the corresponding second bus; determining whether the open circuit is occurred to each of the transmission channels of the corresponding second bus according to the testing result signal.

According to an embodiment of the invention, the electronic devices include a first electronic device and at least one third electronic device, and a signal is transmitted between the first electronic device and the at least one third electronic device through a corresponding third bus having a plurality of transmission channels. The step of testing whether the open circuit is occurred to the bus between the electronic devices respectively corresponding to the device transfer plates includes: providing the serial signal to the device transfer plates corresponding to the first electronic device; receiving a testing result signal from the device transfer plates corresponding to the at least one third electronic device through the corresponding serial signal wire pair, wherein the testing result signal is associated with a signal transmission state of the corresponding third bus; determining whether the open circuit is occurred to each of the transmission channels of the corresponding third bus according to the testing result signal.

According to an embodiment of the invention, the testing method further includes: setting an identification code on each of the device transfer plates.

According to an embodiment of the invention, before the step of providing the serial signal, the testing method further includes: reading the identification codes to determine the types and a testing order of the electronic devices to be tested.

According to an embodiment of the invention, the step of testing whether the open is occurred to the bus between the electronic devices respectively corresponding to the device transfer plates includes: providing a testing signal according to the serial signal, wherein the testing signal is transmitted through the bus between the electronic devices respectively corresponding to the one and the another one of the device transfer plates; generating a testing result signal according to a transmission state of the testing signal through the bus.

According to an embodiment of the invention, the testing signal is a pulse signal, and the step of generating the testing result signal according to the transmission state of the testing signal through the bus includes: calculating a pulse number of the received testing signal; comparing a calculation result with the pulse number of the testing signal provided by the corresponding device transfer plate to generate the testing result signal.

According to an embodiment of the invention, the testing method further includes: obtaining a signal output and received by the corresponding bus; analyzing the obtained signal; transmitting an analysis result back.

In view of the above, a testing apparatus and a testing method of an electronic device are provided in an embodiment of the invention. The testing apparatus may test whether the open circuit is occurred to the bus between the to-be-tested electronic devices through the serial signal provided by the corresponding serial signal wire pair. Since it is not necessary to connect each transmission channel of the bus with the corresponding wire for testing the electronic device, the testing scheme as a whole is simplified, and the accuracy of the testing apparatus described herein is effectively ameliorated.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
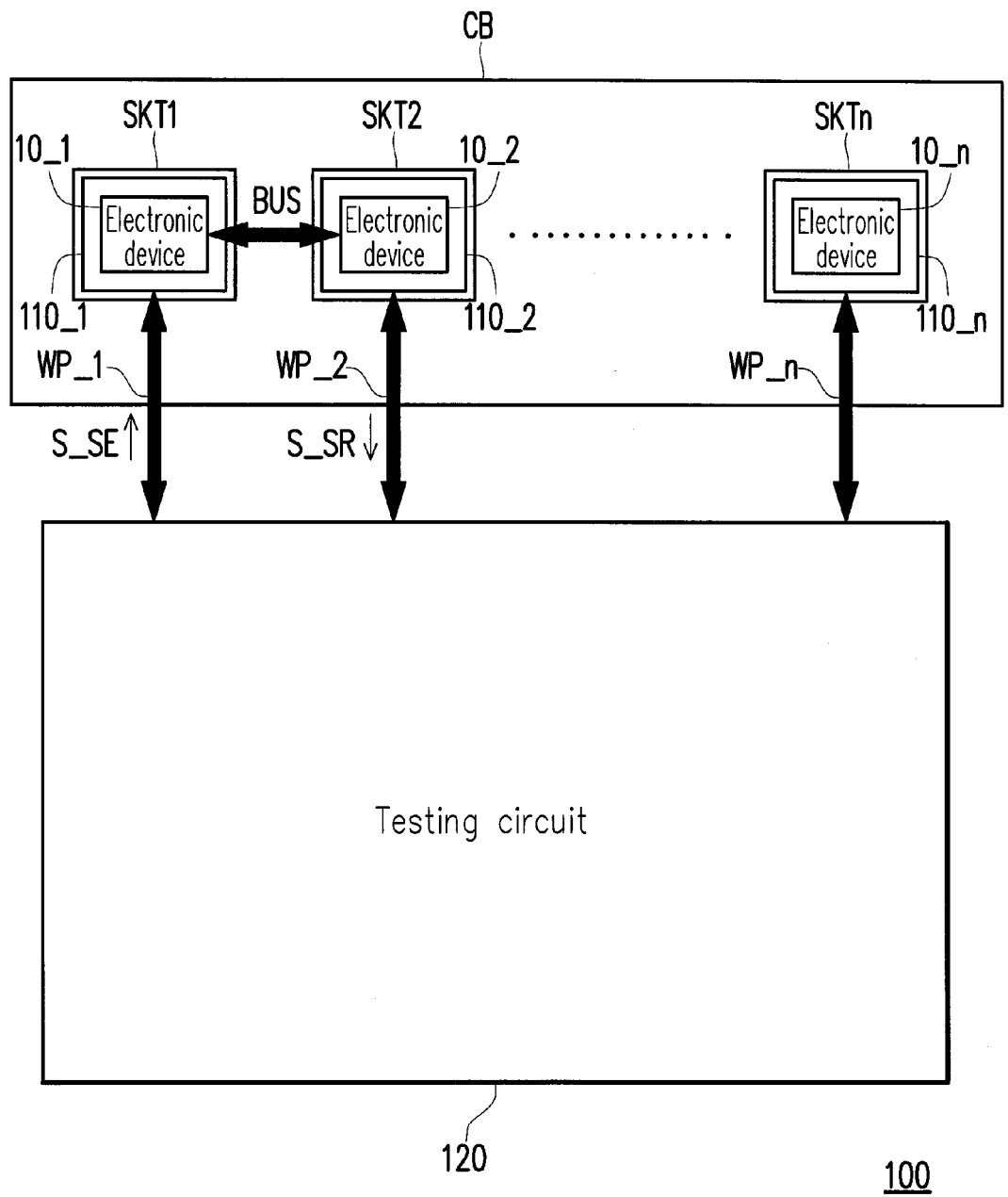
FIG. 1 is a schematic view illustrating a testing apparatus according to an embodiment of the invention.

In an embodiment of the invention, a testing apparatus and a testing method of an electronic device are provided. The testing apparatus may test whether an open circuit is occurred to a bus between the to-be-tested electronic devices through a serial signal that is generated by a serial signal wire pair constituted by two signal wires. Since it is not necessary to connect each transmission channel of the bus with the corresponding wire for testing the electronic device, the accuracy of the testing apparatus described herein may be ameliorated. In order to make the invention more comprehensible, embodiments are described below as examples to prove that the invention can actually be realized. Moreover, elements/components/steps with same reference numerals represent same or similar parts in the drawings and embodiments.

FIG. 1 is a schematic view illustrating a testing apparatus according to an embodiment of the invention. The testing apparatus 100 may serve to test whether an open circuit is occurred to a bus between electronic devices and display information of the problematic bus on a screen or output the information to an external computer device, such that an inspector may perform a debug process and an analysis process according to the detected information. With reference to FIG. 1, the testing apparatus 100 includes device transfer plates 110_1 to 110_n and a testing circuit 120. Electronic devices 10_1 to 10_n are respectively inserted into sockets SKT1 to SKTn on a circuit board CB through the corresponding device transfer plates 110_1 to 110_n, such that the electronic devices 10_1 to 10_n may be electrically connected to each other or one another and thereby transmit data. Here, n is a positive integer and may be changed according to actual design requirements. The testing circuit 120 is electrically connected to the device transfer plates 110_1 to 110_n respectively through plural sets of serial signal wire pairs WP_1 to WP_n. Here, the testing circuit 120 may provide a serial signal (e.g., a serial signal S_SE) through the corresponding serial signal wire pairs WP_1 to WP_n according to types of the electronic devices 10_1 to 10_n, so as to test whether the open circuit is occurred to the bus (e.g., a bus BUS) between the electronic devices 10_1 to 10_n. In the present embodiment, the electronic devices 10_1 to 10_n are, for instance, CPUs, dual inline memory modules (DIMM), double data rate (DDR) memory devices, serial advanced technology attachment (SATA) storage devices, peripheral component interconnect (PCI) devices, PCI Express (PCI-E) devices, serial attached SCSI (SAS) devices, and so forth.

For instance, regardless of the number of the transmission channels of the bus BUS between the to-be-tested electronic devices 10_1 and 10_2, an inspector is able to test each transmission channel of the bus BUS between the to-be-tested electronic devices 10_1 and 10_2 merely by connecting two sets of serial signal wire pairs WP_1 and WP_2 to the device transfer plates 110_1 and 110_2. Each set of serial signal wire pairs WP_1 to WP_n includes two signal wires. Compared to the conventional testing apparatus that is required to be sequentially connected to each transmission pin of the bus, the testing apparatus described in the present embodiment is conducive to simplification of the testing process.

Besides, in the present embodiment, electrical connection configurations between the device transfer plates 110_1 to 110_n may be different according to the transmission scheme of the bus between the to-be-tested electronic devices 10_1 to 10_n, so as to provide the bus with a external transmission path.

Figure 2:
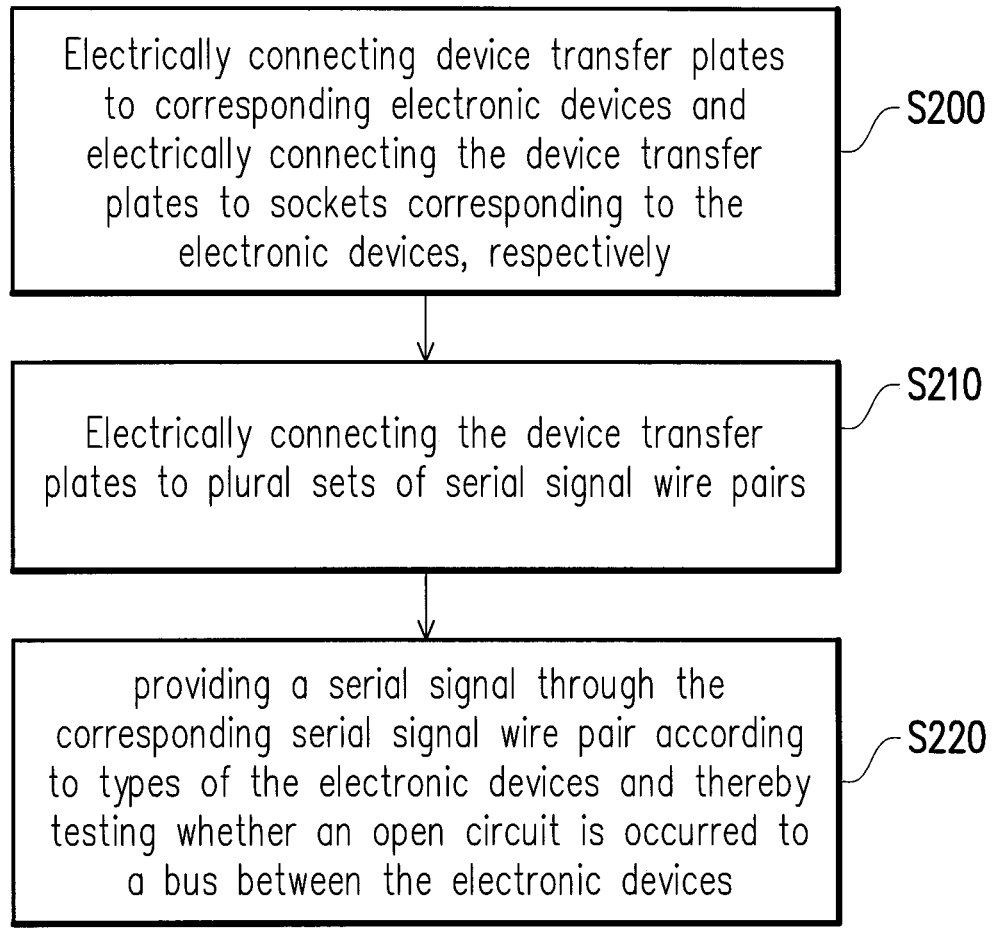
FIG. 2 is a flowchart illustrating a testing method of an electronic device according to an embodiment of the invention.

FIG. 2 is a flowchart illustrating a testing method of an electronic device according to an embodiment of the invention. With reference to FIG. 1 and FIG. 2, during the test, an inspector may electrically connect the device transfer plates 110_1 to 110_n to the electronic devices 10_1 to 10_n corresponding to the device transfer plates 110_1 to 110_n and electrically connect the device transfer plates 110_1 to 110_n to the sockets SKT1 to SKTn corresponding to the electronic devices 10_1 to 10_n, respectively (step S200). That is, the device transfer plates 110_1 to 110_n are inserted into the corresponding sockets SKT1 to SKTn on the to-be-tested circuit board CB, and the to-be-tested electronic devices 10_1 to 10_n are inserted into the corresponding device transfer plates 110_1 to 110_n. The device transfer plates 110_1 to 110_n are electrically connected to plural sets of serial signal wire pairs WP_1 to WP_n in step S210. Thereby, each of the device transfer plates 110_1 to 110_n is electrically connected to the testing circuit 120 and is electrically connected to one of the corresponding to-be-tested electronic devices 10_1 to 10_n, respectively. According to types of the electronic devices 10_1 to 10_n, the testing circuit 120 provides a serial signal S_SE to one of the device transfer plates (e.g., the device transfer plate 110_1) through the corresponding serial signal wire pair (e.g., WP_1) and receives a response from another one of the device transfer plates (e.g., the device transfer plate 110_1) through the corresponding serial signal wire pair (e.g., WP_2), so as to test whether the open circuit is occurred to the bus (e.g., the bus BUS) between the electronic devices (e.g., the electronic devices 10_1 and 10_2) respectively corresponding to the two device transfer plates (step S220). Based on the above-mentioned steps, the inspector is able to sequentially test whether the open circuit is occurred to the buses between the electronic devices 10_1 to 10_n.

For instance, given that the bus BUS between the electronic devices 10_1 and 10_2 is to be tested, the testing circuit 120 first determines the types and the testing order of the to-be-tested electronic devices 10_1 and 10_2 and thereby generates the corresponding serial signal S_SE. Through the serial signal wire pair WP_1, the testing circuit 120 transmits the serial signal S_SE to the device transfer plate 110_1, such that the electronic device 10_1 on the device transfer plate 110_1 responds to the serial signal S_SE and transmits a testing signal to the electronic device 10_2 through each transmission channel of the bus BUS. According to the signal received by the electronic device 10_2, the device transfer plate 110_2 transmits a testing result signal S_SR back to the testing circuit 120, and therefore the testing circuit 120 is able to determine whether the open circuit is occurred to each transmission channel of the bus BUS according to the testing result signal S_SR. Here, the testing circuit 120 may further display the testing result through a built-in or an external display module (not shown) or output the information of the testing result to an external computer device for further analysis.

Figure 3:
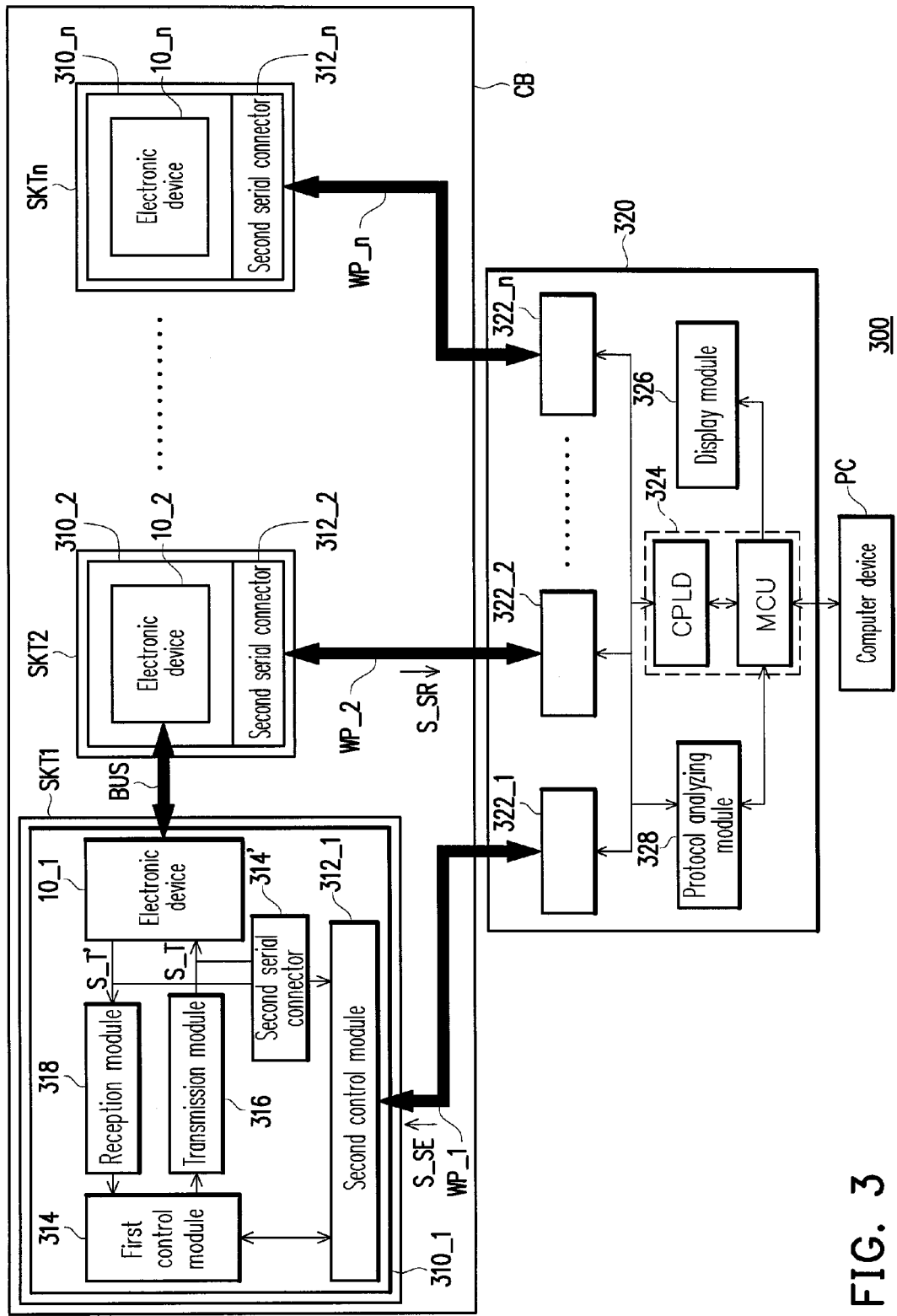
FIG. 3 is a schematic view illustrating a testing apparatus according to another embodiment of the invention.

FIG. 3 schematically illustrates a testing apparatus according to another embodiment of the invention to further elaborate the structure of the testing apparatus. With reference to FIG. 3, the testing apparatus 300 includes device transfer plates 310_1 to 310_n and a testing circuit 320. Each of the to-be-tested electronic devices 10_1 to 10_n is respectively inserted into the corresponding sockets SKT1 to SKTn on a circuit board CB through one of the corresponding device transfer plates 310_1 to 310_n, such that the electronic devices 10_1 to 10_n may be electrically connected to each other or one another and thereby transmit data. Each of the device transfer plates 310_1 to 310_n includes one of second serial connectors 312_1 to 312_n, a first control module, a second control module, a transmission module, and a reception module. Since the structure of each of the device transfer plates 310_1 to 310_n is substantially the same, the device transfer plate 310_1 is taken as an example to explain the invention. Here, the device transfer plate 310_1 includes the second serial connector 312_1, a first control module 314, a second control module 314', a transmission module 316, and a reception module 318.

In the device transfer plate 310_1, the first control module 314 is electrically connected to the second serial connector 312_1. The transmission module 316 and the reception module 318 are electrically connected to the first control module 314 and the corresponding electronic device 10_1. The second control module 314' is electrically connected to the second serial connector 312_1, the transmission module 316, and the reception module 318. Here, the first control module 314 receives the serial signal S_SE from the testing circuit 320 through the second serial connector 312_1 and thereby controls the operation of the transmission module 316 and the reception module 318. The transmission module 316 is controlled by the first control module 314 and provides a testing signal S_T, such that the electronic device 10_1 transmits the testing signal S_T to other to-be-tested electronic devices (e.g., the electronic devices 10_2 to 10_n) through a specific bus (e.g., the bus BUS). The reception module 318 receives the testing signal S_T' transmitted by other corresponding to-be-tested electronic devices (e.g., the electronic devices 102 to 10_n) through a specific bus (e.g., the bus BUS), and transmits the testing signal S_T' back to the first control module 314, such that the first control module 314 generates a testing result signal.

In the testing circuit 320, a processing unit 324 is electrically connected to the first serial connectors 322_1 to 322_n. A display module 326 and a protocol analyzing module 328 are electrically connected to the processing unit 324, respectively. Each of the first serial connectors 322_1 to 322_n is electrically connected to the second serial connectors 312_1 to 312_n of the device transfer plates 310_1 to 310_n through the corresponding serial signal wire pairs WP_1 to WP_n, respectively. Here, the processing unit 324 serves to generate the serial signal S_SE according to the types of the electronic devices 10_1 to 10_n, so as to control signal transmission and signal reception of the device transfer plates 310_1 to 310_n. The display module 326 is controlled by the processing unit 324 for displaying a testing result of the electronic devices 10_1 to 10_n. In addition, the processing unit 324 may also output the information relevant to the testing result to an external computer device PC, such that the inspector may correspondingly analyze the transmission state of the bus.

To be specific, the inspector may set identification codes corresponding to the device transfer plates 310_1 to 310_n in advance, and the identification codes respectively correspond to the types of the electronic devices 10_1 to 10_n on the device transfer plates 310_1 to 310_n. During the test, the processing unit 324 reads the identification codes corresponding to the device transfer plates 310_1 to 310_n, so as to determine the types and a testing order of the electronic devices to be tested, and thereby the processing unit 324 provides the corresponding serial signal S_SE. According to the serial signal S_SE, the first control module 314 may learn the type of the electronic device 10_1, the type of the testing signal S_T (e.g., a direct-current signal or a pulse signal), the set value of the testing signal S_T (e.g., the frequency or the pulse number), and a testing order detected by the processing unit 324. Therefore, the first control module 314 is able to timely control the transmission module 316 to provide the corresponding testing signal S_T to the electronic device 10_1. That is, the testing signal S_T provided by the transmission module 316 may be a direct-current signal or a pulse signal, and the first control module 314 is able to set the frequency and the pulse number of the testing signal S_T according to the serial signal S_SE.

Additionally, according to the different types of the to-be-tested electronic devices, the processing unit 324 may determine how the device transfer plates 310_1 to 310_n generate the corresponding testing result signal S_SR. For instance, the testing result signal may be generated by comparing the testing signal output by the transmission module and received by the corresponding reception module or by comparing the pulse number of the testing signal output by the transmission module and received by the corresponding reception module within a certain period, which will be further explained below.

When actually applied, the processing unit 324 may be implemented in form of a micro-controller unit (MCU) and a complex programmable logic device (CPLD). Here, the MCU is able to perform the high-level signal processing process, whereas the CPLD is able to perform the low-level logic calculation process and provide plural transmission ports that are connected to the first serial connectors 322_1 to 322_n. However, the invention is not limited thereto.

From another perspective, the testing circuit 320 may use less number of wires to connect the device transfer plates 310_1 to 310_n; thus, the testing circuit 320 may have great flexibility in space design. As such, in the testing apparatus 300, a second control module (e.g., the second control module 314') and the protocol analyzing module 328 may be additionally placed between the device transfer plates 310_1 to 310_n and the testing circuit 320, so as to analyze and debug the bus protocol of certain electronic devices.

In particular, the second control module 314' may be applied to obtain the signal output and received by the bus BUS and transmit the signal back to the protocol analyzing module 328 through the second serial connector 312_1. After the protocol analyzing module 328 analyzes the signal that is output and received by the bus BUS and obtained by the second control module 314', the protocol analyzing module 328 transmits an analysis result back to the processing unit 324. Hence, the processing unit 324 may output the information relevant to the analysis result to an external computer device PC, such that the inspector may further perform subsequent verification and debug processes.

Note that the function of analyzing the bus protocol of the electronic device is a design choice, and the designer may determine whether to add the function or not based on actual requirements. Namely, in other embodiments of the invention, the device transfer plates 310_1 to 310_n may not include the second control module, and the testing circuit 320 may not include the protocol analyzing module 328. Whether the device transfer plates 310_1 to 310_n include the second control module and whether the testing circuit 320 includes the protocol analyzing module 328 do not affect the function of the testing apparatus with respect to test whether the open circuit is occurred to the corresponding bus.

For further describe the invention, the transmission test of the bus between CPUs, between a CPU and a DIMM, and between a CPU and a PCI-E device is exemplified below to explain the testing scheme of the testing apparatus and the testing method of the electronic device, which should however not be construed as limitations to the invention. Besides, in the following embodiments, only the second serial connector and the electronic device corresponding to each device transfer plate are shown in the drawings for clarification purposes. However, the structure of the device transfer plate described in any of the following embodiments may be substantially referred to as that described in the embodiment shown in FIG. 3.

Figure 4:
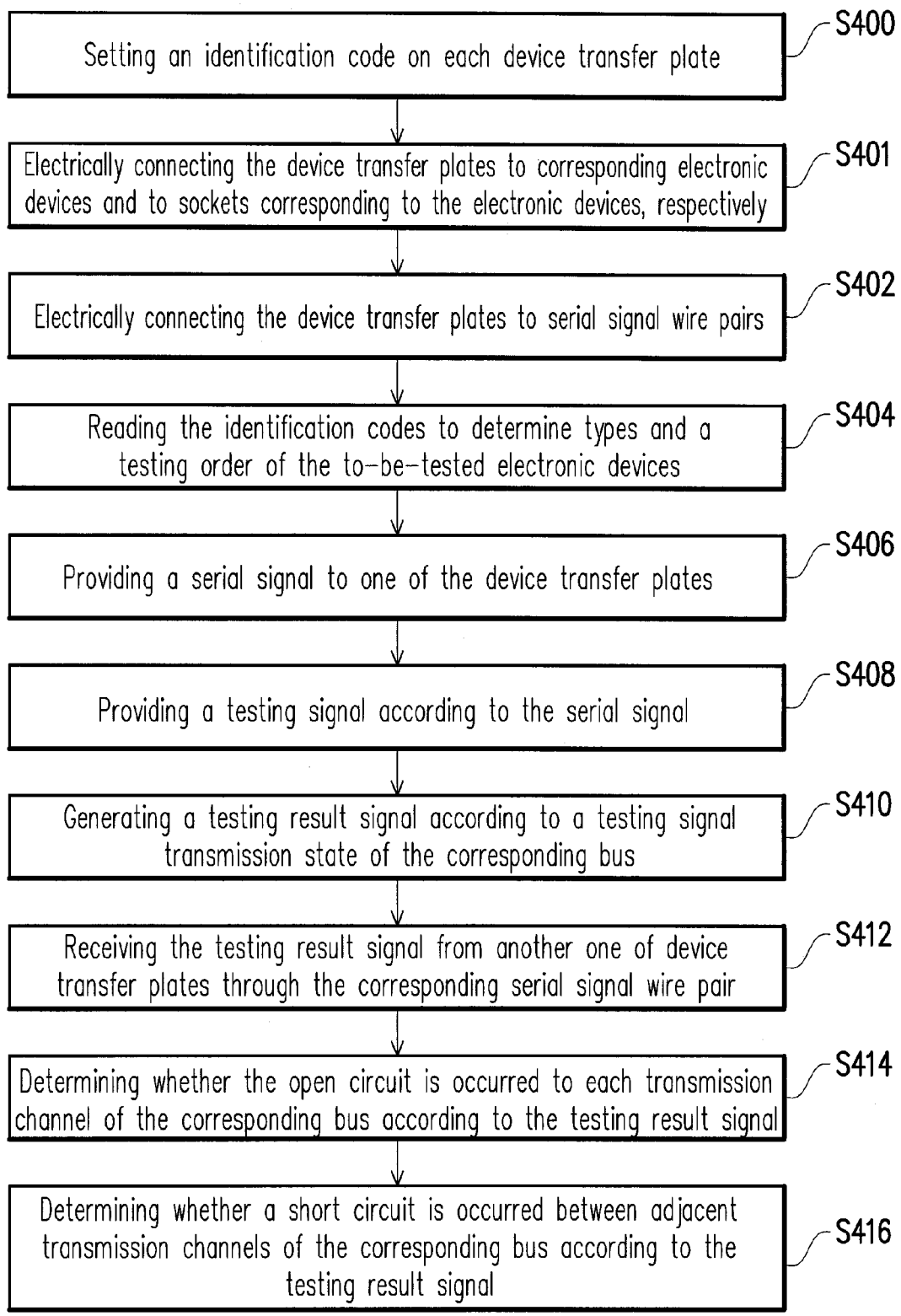
FIG. 4 is a flowchart illustrating a process of testing signal transmission status through buses between central processing units (CPUs) according to an embodiment of the invention.

FIG. 4 is a flowchart illustrating a process of testing signal transmission status through buses between CPUs according to an embodiment of the invention. In the present embodiment, signals may be transmitted between the CPUs through a QPI bus, for instance.

With reference to FIG. 4, prior to the test, an inspector may set identification codes on the corresponding device transfer plates (step S400). When the test is started, the device transfer plates (e.g., the device transfer plates 110_1 to 110_n) are electrically connected to the corresponding electronic devices (e.g., the electronic devices 10_1 to 10_n) and electrically connected to the sockets (e.g., the sockets SKT1 to SKTn) corresponding to the electronic devices, respectively (step S401). That is, the device transfer plates are inserted into the corresponding sockets on the to-be-tested circuit board (e.g., the circuit board CB), and the electronic devices are inserted into the corresponding device transfer plates. The device transfer plates are then electrically connected to plural sets of serial signal wire pairs (e.g., the serial signal wire pairs WP_1 to WP_n) in step S402. Thereby, each of the device transfer plates is electrically connected to the testing circuit, and the processing unit of the testing circuit respectively reads the identification codes on the device transfer plates to determine the types and the testing order of the to-be-tested electronic devices (step S404).

In the present embodiment, the processing unit determines whether or not the bus between the to-be-tested electronic devices is a bus between CPUs according to the identification codes read by the processing unit; therefore, according to the testing order, the processing unit provides a corresponding serial signal to one of the device transfer plates (hereinafter "the transmission end") in step S406. According to the serial signal, the device transfer plate which correspondingly receives the serial signal provides a testing signal in step S408, and the testing signal is transmitted through the bus between the CPU of the transmission end and a CPU on another device transfer plate.

The device transfer plate corresponding to the CPU that receives the testing signal is referred to as a reception end hereinafter, and the reception end generates a testing result signal according to the testing signal transmission state of the corresponding bus (step S410). Here, the signal transmission state is the transmission state of the testing signal through each transmission channel of the bus.

After the reception end generates the corresponding testing result signal, the processing unit receives the testing result signal through the serial signal wire pair corresponding to the reception end (step S412) and thereby determines whether the open circuit is occurred to each transmission channel of the corresponding bus (step S414).

In other words, after the testing circuit provides the serial signal to one of the device transfer plates, another one of the device transfer plates or the other device transfer plate responds to the signal transmission state of the corresponding bus and outputs the testing result signal to the testing circuit through the corresponding serial signal wire pair. At this time, the testing circuit determines whether the open circuit is occurred to each of the transmission channels of the corresponding bus according to the testing result signal.

Besides, the processing unit may also determine whether a short circuit is occurred between adjacent transmission channels of the corresponding bus according to the testing result signal (step S416). The steps S414 and S416 may, according to actual design, be performed simultaneously or sequentially. It is also possible to perform one of the steps S414 and S416. Note that the method and the process shown in the present embodiment are merely exemplary and should not be construed as limitations to the invention.

The processing unit then sequentially provides the serial signal to each device transfer plate as the transmission end and allows other device carriers to act as the reception end, so as to sequentially test the bus between the CPUs. That is, after the step S416, the step S408 may be performed to select another device transfer plate as the reception end, and this process may be finished after the processing unit determines that the test on the transmission through the bus between the CPUs is completed.

Figure 5A:
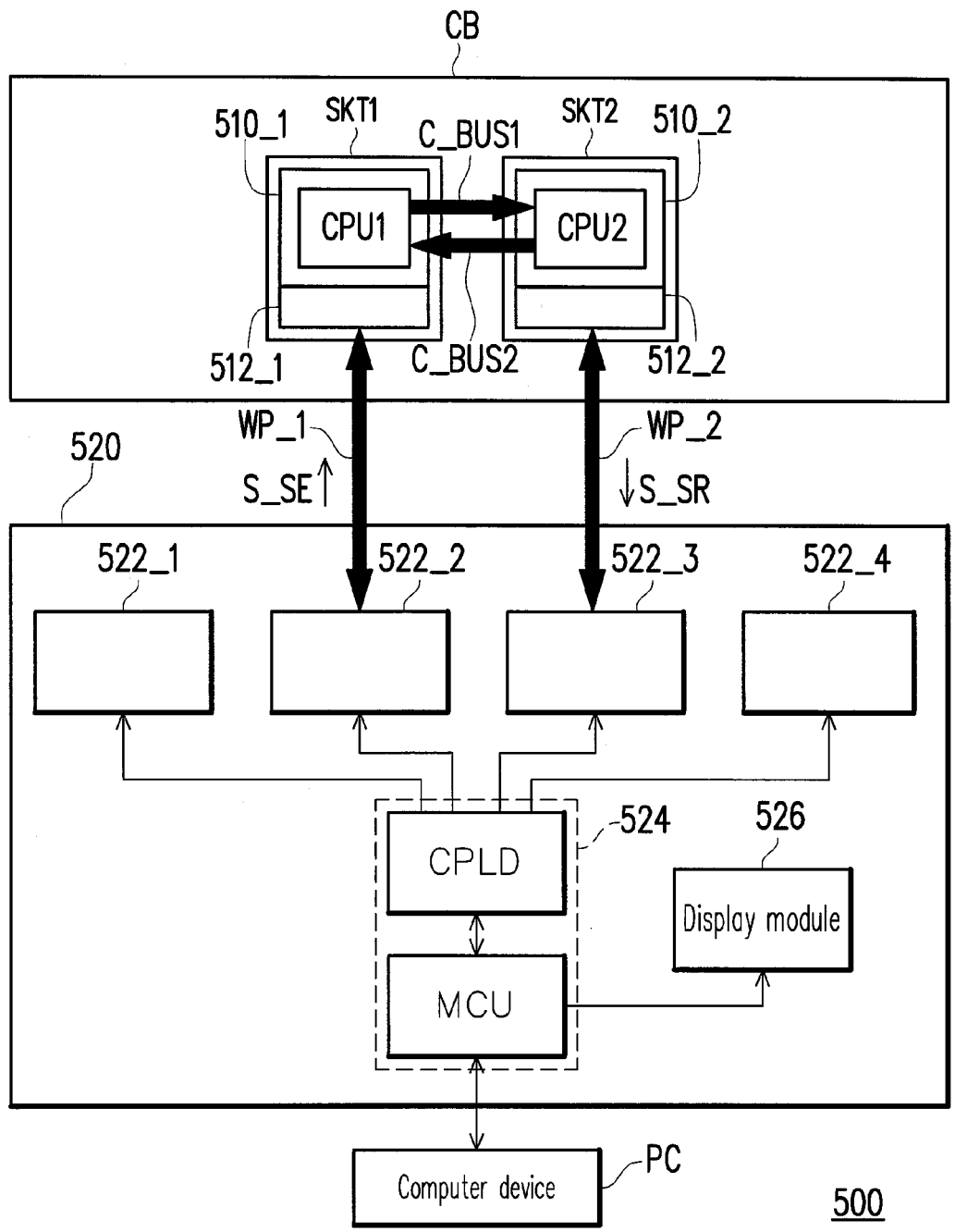
FIG. 5A to FIG. 5C schematically illustrate testing signal transmission status through buses between CPUs according to different embodiments of the invention.
Figure 5B:
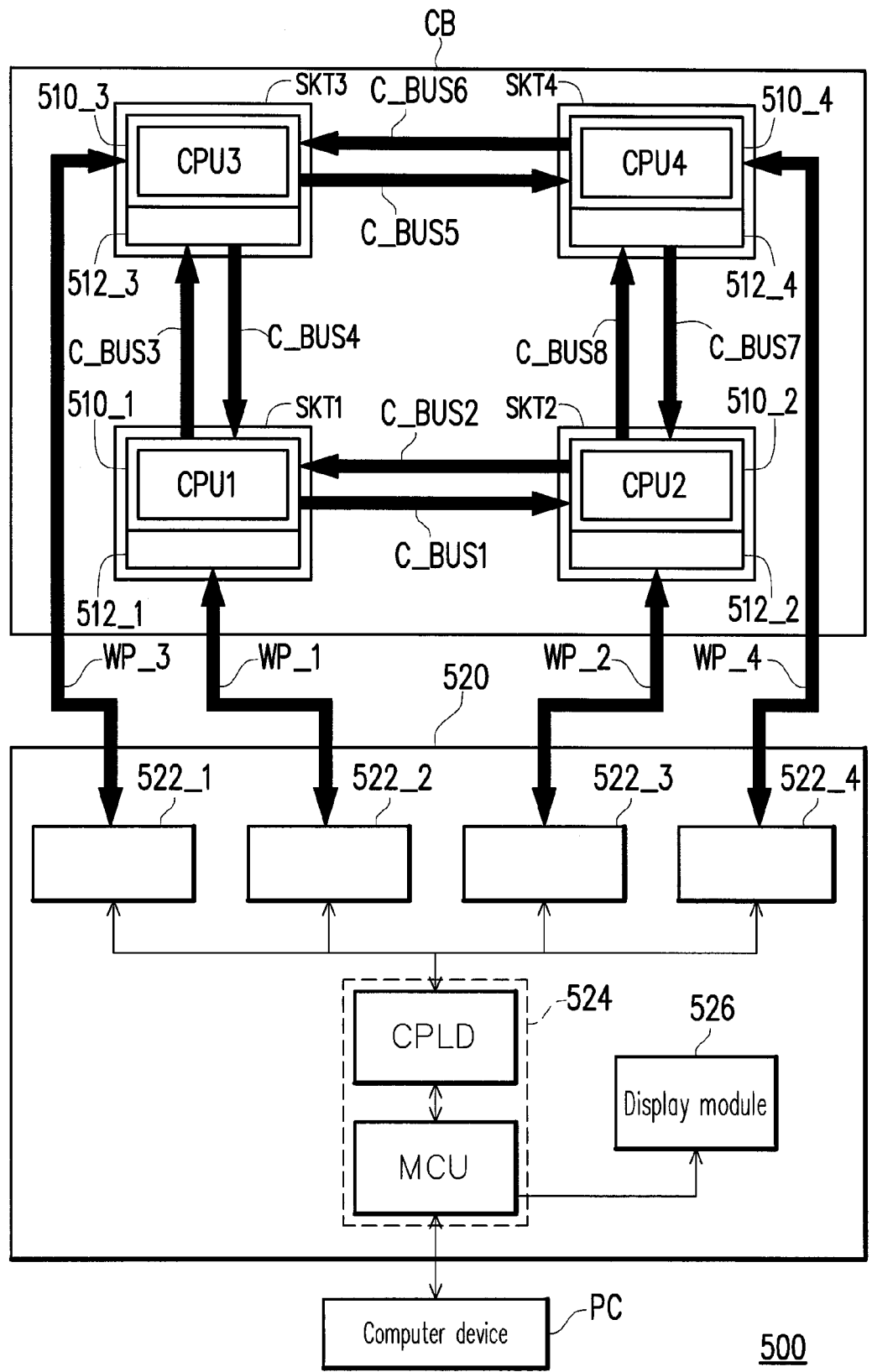
Figure 5C:
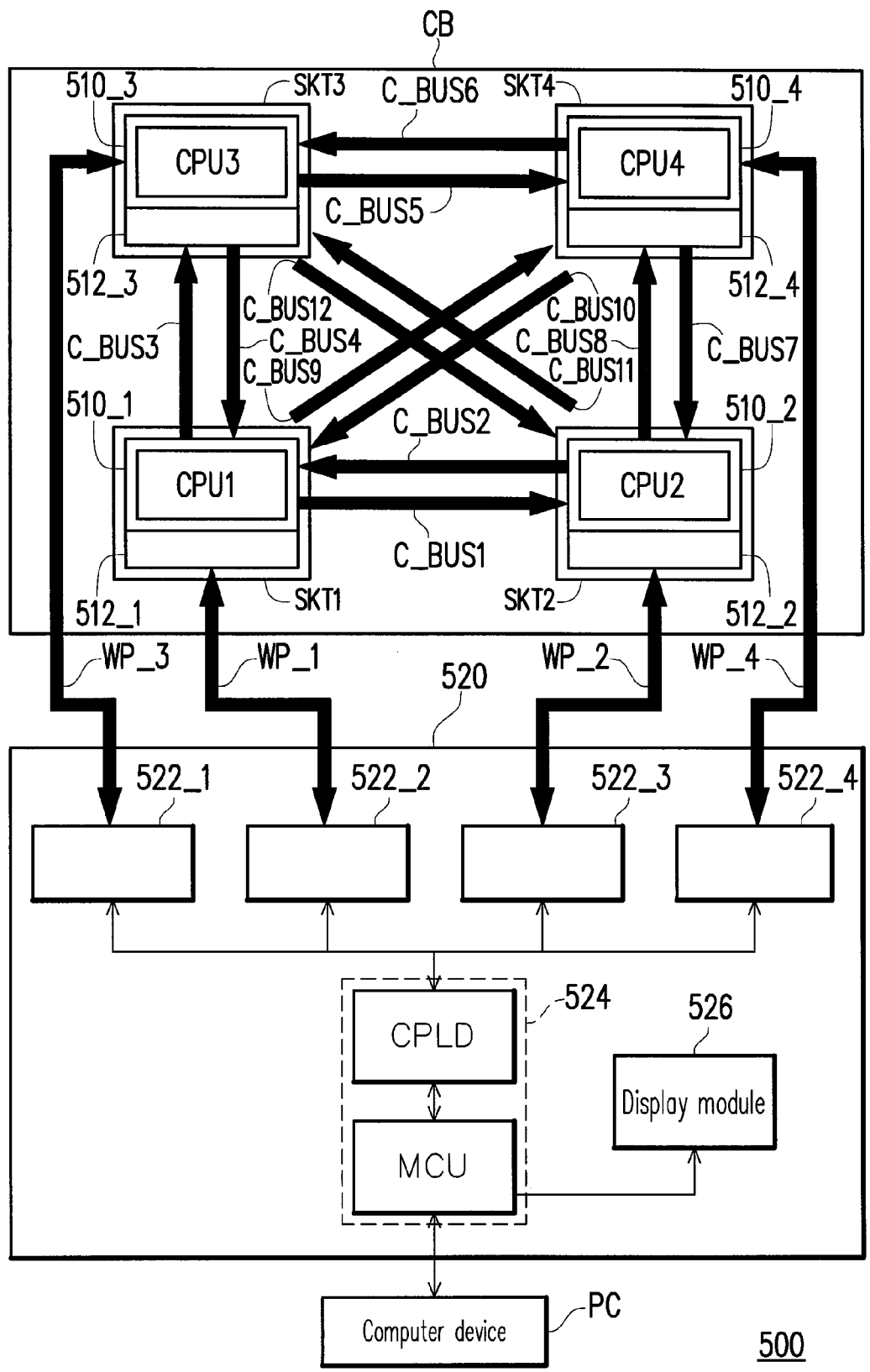

FIG. 5A to FIG. 5C schematically illustrate testing signal transmission status through a bus between CPUs according to different embodiments of the invention to further elaborate the testing method of the bus between the CPUs. Here, FIG. 5A shows the test performed by a testing apparatus 500 on the bus between two CPUs; FIG. 5B and FIG. 5C respectively show the test performed by the testing apparatus 500 on the buses between four CPUs with different specifications.

With reference to FIG. 5A, the testing apparatus 500 includes device transfer plates 510_1 and 510_2 and a testing circuit 520. The device transfer plates 510_1 and 510_2 respectively include the corresponding second serial connectors 512_1 and 512_2, and the testing circuit 520 includes first serial connectors 522_1 to 522_4, a processing unit 524, and a display module 526. Here, a signal is transmitted between CPU1 and CPU2 through buses C_BUS1 and C_BUS2. The functions of other components in the device transfer plates 510_1 and 510_2 and the testing circuit 520 may be referred to as those described in the previous embodiments and thus will not be further described hereinafter.

In the present embodiment, the device transfer plates 510_1 and 510_2 are electrically connected to the to-be-tested CPU1 and CPU2, respectively, and the device transfer plates 510_1 and 510_2 are respectively inserted into the corresponding sockets SKT1 and SKT2 on the circuit board CB, such that the to-be-tested CPU1 and CPU2 are electrically connected through the corresponding buses C_BUS1 and C_BUS2 and the corresponding route wires on the circuit board CB.

As described above, after the device transfer plates 510_1 and 510_2 are electrically connected to the testing circuit 520 through the corresponding serial signal wire pairs WP_1 and WP_2, respectively, the processing unit 524 of the testing circuit 520 reads the identification codes on the device transfer plates 510_1 and 510_2 to determine that the to-be-tested electronic devices are CPU1 and CPU2. Besides, the testing order is from CPU1 to CPU2 and then from CPU2 to CPU1. The processing unit 524 then provides the serial signal S_SE to the device transfer plate 510_1 as the transmission end, such that the device transfer plate 510_2 responds to the testing signal transmitted through the bus C_BUS1 and generates and outputs the testing result signal S_SR to the processing unit 524. According to the testing result signal S_SR, the processing unit 524 may determine whether the open/short circuit is occurred to the bus C_BUS1 from CPU1 to CPU2.

After the test on the bus C_BUS1 between CPU1 and CPU2 is completed, the processing unit 524 provides the serial signal S_SE to the device transfer plate 510_2 as the transmission end, such that the device transfer plate 510_1 responds to the signal transmitted through the bus C_BUS2 and outputs the corresponding testing result signal S_SR to the processing unit 524. According to the testing result signal S_SR, the processing unit 524 may determine whether the open/short circuit is occurred to the bus C_BUS2 from CPU2 to CPU1

With reference to FIG. 5B, when four CPUs (i.e., CPU1, CPU2, CPU3, and CPU4) are given, the device transfer plates 510_1 to 510_4 are electrically connected to the to-be-tested CPU1 to CPU4, respectively, and the device transfer plates 510_1 to 510_4 are respectively inserted into the sockets SKT1 to SKT4 on the circuit board CB. In the present embodiment, corresponding route wires may be configured among the sockets SKT1 to SKT4 on the circuit board CB, such that the to-be-tested CPU1 to CPU4 may be electrically connected to each other through the corresponding bus and the corresponding route wires on the circuit board CB. For instance, CPU1 is electrically connected to CPU2 and CPU3, CPU2 is electrically connected to CPU4, and CPU3 is electrically connected to CPU4.

Although four CPUs are given in the present embodiment, the testing circuit 520 is able to sequentially test the buses C_BUS1 to C_BUS8 respectively between two adjacent CPUs, and thus descriptions identical or similar to those provided before will not be further provided hereinafter.

With reference to FIG. 5C, the difference between the present embodiment and the embodiment shown in FIG. 5B lies in the specifications of the CPUs and the resultant connection manner of the buses between the CPUs on a motherboard. In the present embodiment, corresponding route wires may be configured among the sockets SKT1 to SKT4 on the circuit board CB, such that the to-be-tested CPU1 to CPU4 may be electrically connected to the other three CPUs through the corresponding buses C_BUS1 to C_BUS8 and the corresponding route wires on the circuit board CB. For instance, CPU1 is electrically connected to CPU2, CPU3, and CPU4, CPU2 is electrically connected to CPU1, CPU3, and CPU4, CPU3 is electrically connected to CPU1, CPU2, and CPU4, and CPU4 is electrically connected to CPU1, CPU2, and CPU3. According to the embodiments shown in FIG. 5B and FIG. 5C, the testing apparatus 500 may effectively test the actual transmission operation of the buses between the four CPUs (the electronic devices).

Under the four-CPU scheme described in the present embodiment, the testing method described herein is applied to further test the buses C_BUS9 and C_BUS10 between CPU1 and CPU4 as well as the buses C_BUS11 and C_BUS12 between CPU2 and CPU3 in comparison with the testing method described in the embodiment shown in FIG. 5B, while other testing steps and testing scheme depicted in FIG. 5C are substantially the same as those depicted in FIG. 5B; therefore, no further description is provided hereinafter.

Figure 6A:
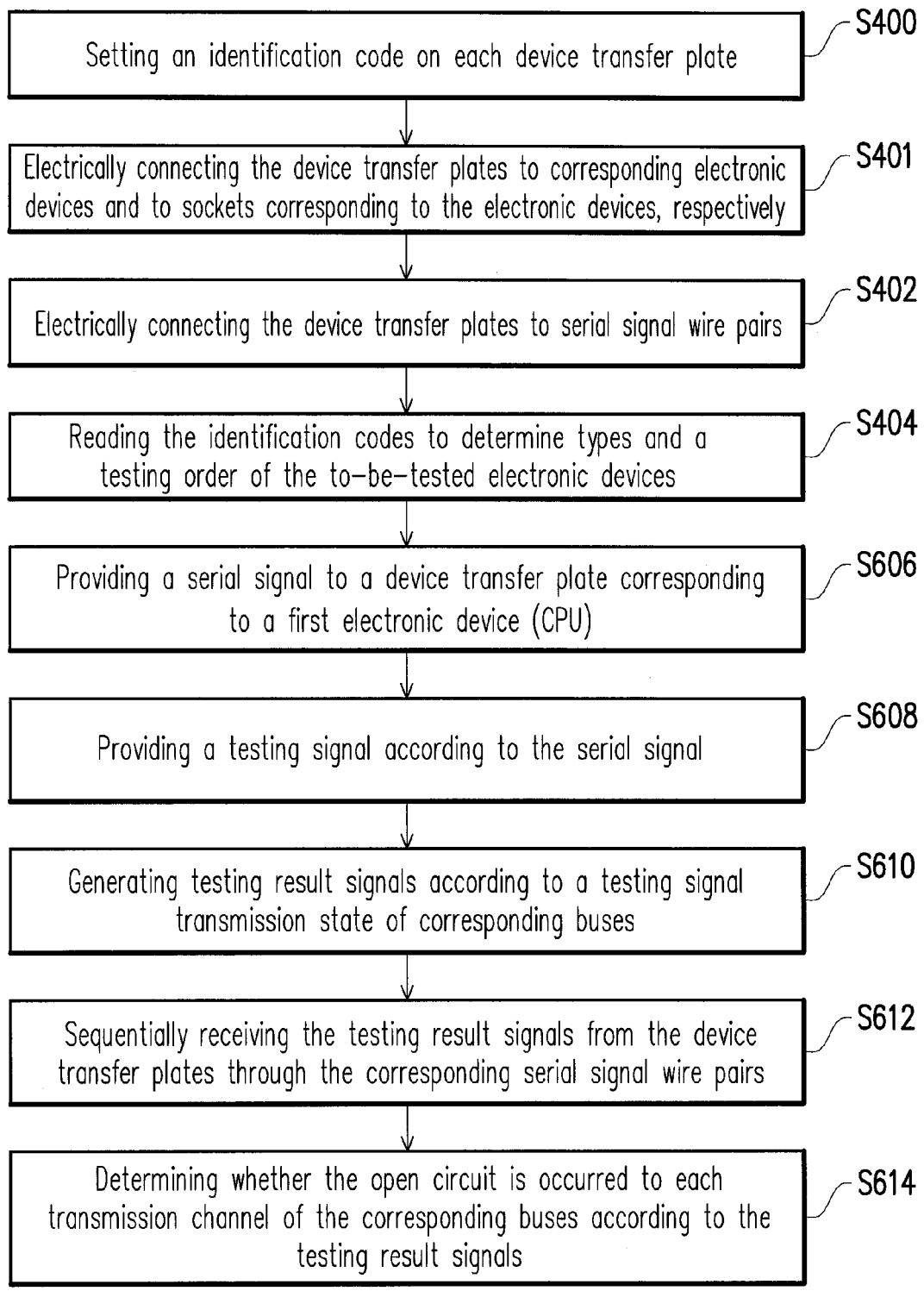
FIG. 6A is a flowchart illustrating a process of testing signal transmission status through buses between CPU and dual inline memory modules (DIMMs) according to an embodiment of the invention.
Figure 7:
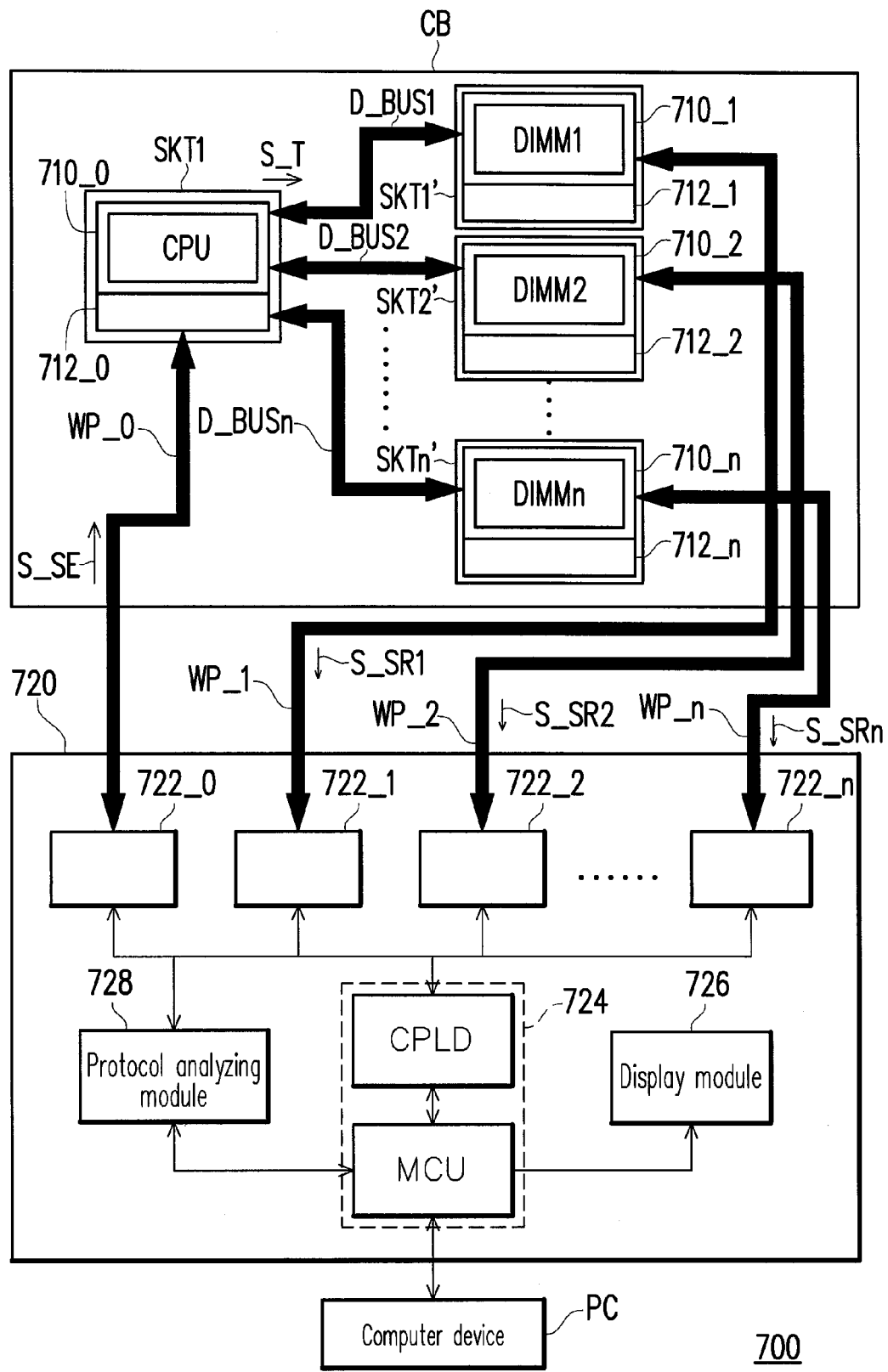
FIG. 7 is a schematic view illustrating a process of testing signal transmission status through buses between CPU and DIMMs according to an embodiment of the invention.

FIG. 6A is a flowchart illustrating a process of testing signal transmission status through buses between CPU and DIMMs according to an embodiment of the invention. FIG. 7 is a schematic view illustrating a process of testing signal transmission status through buses between CPU and DIMMs according to an embodiment of the invention.

With reference to FIG. 7, the testing apparatus 700 includes device transfer plates 710_1 to 710_n and a testing circuit 720. The device transfer plates 710_1 to 710_n respectively include the corresponding second serial connectors 712_0 to 712_n, and the testing circuit 720 includes first serial connectors 722_0 to 724_n, a processing unit 724, a display module 726, and a protocol analyzing module 728. Here, a signal is transmitted between a CPU and DIMM1 to DIMMn through corresponding buses D_BUS1 to D_BUSn, respectively. The functions of other components in the device transfer plates 710_0 to 710_n and the testing circuit 720 may be referred to as those described in the previous embodiments and thus will not be further described hereinafter.

In the present embodiment, the device transfer plates 710_0 to 710_n are electrically connected to the to-be-tested CPU and DIMM1 to DIMMn, respectively, and the device transfer plate 710_0 to 710_n is respectively inserted into the corresponding sockets SKT1' to SKTn' on the circuit board CB, such that the to-be-tested CPU and DIMM1 to DIMMn are electrically connected through the corresponding buses D_BUS1 to D_BUSn and the corresponding route wires on the circuit board CB.

Steps S400 to S404 shown in FIG. 6A are the same as those described in the embodiment shown in FIG. 4, and therefore no relevant description is further provided herein. With reference to FIG. 6A and FIG. 7, after the processing unit 724 performs the step S404, the processing unit 724 determines the buses corresponding to the to-be-tested electronic devices are the buses D_BUS1 to D_BUSn between CPU and DIMMs according to the identification codes read by the processing unit 724, and thus the processing unit 724 provides a corresponding serial signal S_SE to the device transfer plate 710_0 corresponding to the CPU in step S606. The device transfer plate 710_0 provides a testing signal S_T according to the serial signal S_SE in step S608, and the testing signal S_T is transmitted through the buses D_BUS1 to D_BUSn between a CPU and DIMM1 to DIMMn.

The device transfer plates 710_1 to 710_n corresponding to DIMM1 to DIMMn that receive the testing signal S_T respectively generate testing result signals S_SR1 to S_SRn according to the testing signal transmission state of the corresponding buses D_BUS1 to D_BUSn (step S610). Here, the signal transmission state is the transmission state of the testing signal S_T through each transmission channel of the buses D_BUS1 to D_BUSn.

After the device transfer plates 710_1 to 710_n respectively generate the corresponding testing result signals S_SR1 to S_SRn, the processing unit 724 sequentially receives the testing result signals S_SR1 to S_SRn from the device transfer plates 710_1 to 710_n through the corresponding serial signal wire pairs WP_1 to WP_n (step S612) and thereby determines whether the open circuit is occurred to each transmission channel of the corresponding buses D_BUS1 to D_BUSn (step S614).

In other words, after the testing circuit 720 provides the serial signal S_SE to the device transfer plate 710_0 corresponding to CPU, the device transfer plates 710_1 to 710_n respectively respond to the signal transmission state of the corresponding buses D_BUS1 to D_BUSn and output the testing result signals S_SR1 to S_SRn to the testing circuit 720 through the corresponding serial signal wire pair WP_1 to WP_n, respectively. At this time, the testing circuit 720 determines whether the open circuit is occurred to each of the transmission channels of the corresponding buses D_BUS1 to D_BUSn according to the testing result signals S_SR1 to S_SRn.

Figure 6B:
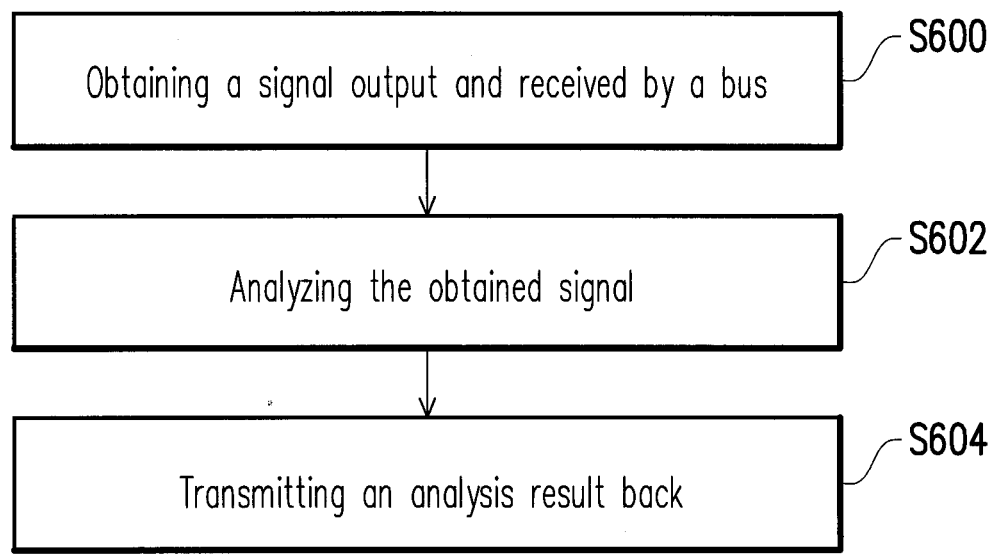
FIG. 6B is a flowchart illustrating a process of analyzing a bus protocol of DRAMs in DIMMs according to an embodiment of the invention.

FIG. 6B is a flowchart illustrating a process of analyzing a DRAM bus protocol of DIMMs according to an embodiment of the invention. In the present embodiment, the testing apparatus 700 may further analyze a bus protocol of a plurality of DRAMs (not shown) in DIMM1 to DIMMn by means of a protocol analyzing module 728.

With reference to FIG. 6B and FIG. 7, the device transfer plates 710_1 to 710_n obtain signals output and received by the buses D_BUS1 to D_BUSn corresponding to the to-be-tested DRAMs in step S600. At this time, the signals transmitted through the buses D_BUS1 to D_BUSn comply with the DRAM bus protocol. The device transfer plates 710_1 to 710_n then output the obtained signals to the protocol analyzing module 728 of the testing circuit 720 through the corresponding serial signal wire pairs WP_1 to WP_n, such that the protocol analyzing module 728 is allowed to analyze the signals obtained by the device transfer plates 710_1 to 710_n. After analyzing the signals, the protocol analyzing module 728 transmits the analysis result back to the MCU of the processing unit 724 in step S604. The MCU may further output the information relevant to the analysis result to an external computer device PC, such that an inspector may perform subsequent verification and debug processes.

Figure 8:
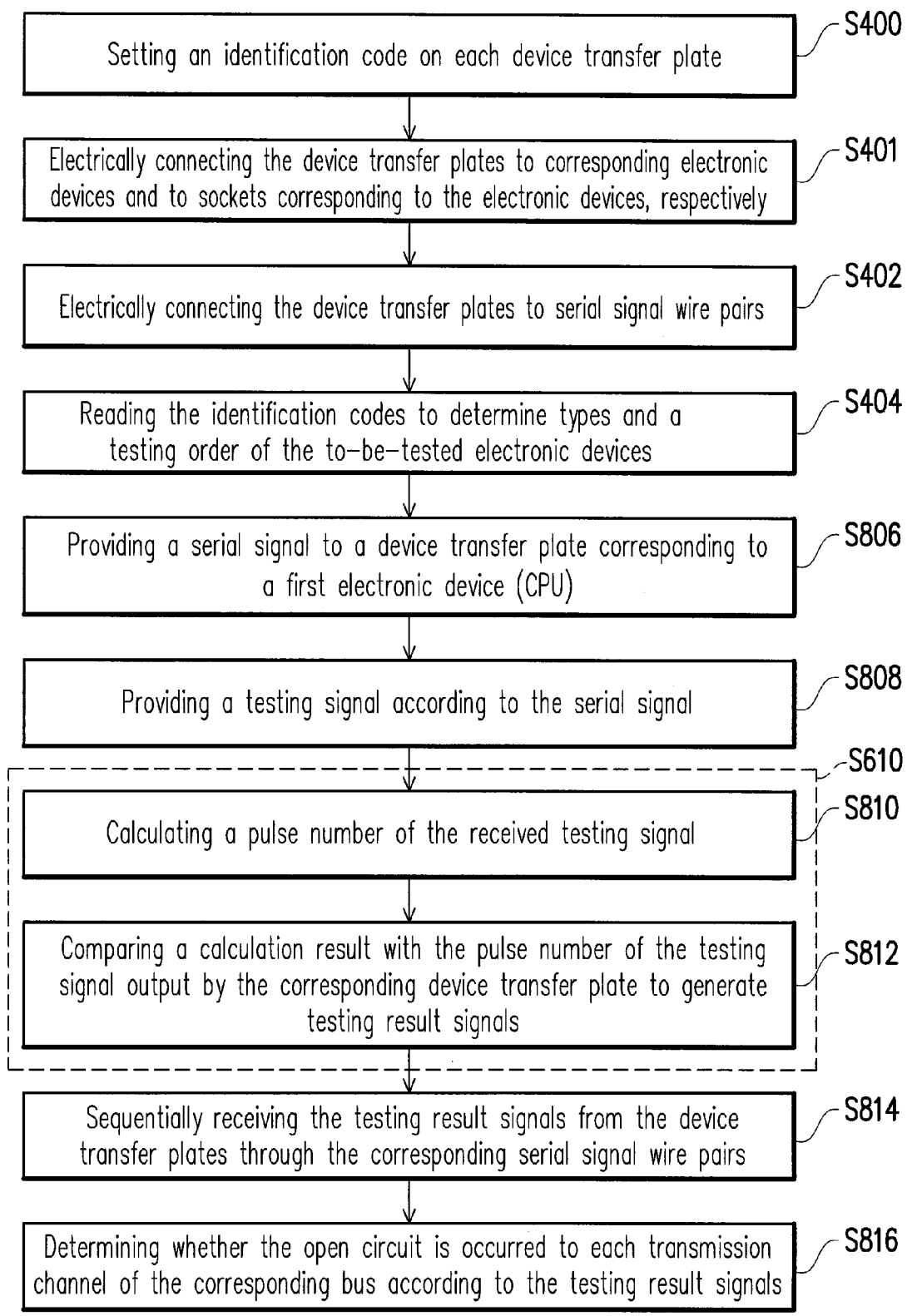
FIG. 8 is a flowchart illustrating a process of testing signal transmission status through buses between CPU and PCI Express (PCI-E) devices according to an embodiment of the invention.
Figure 9:
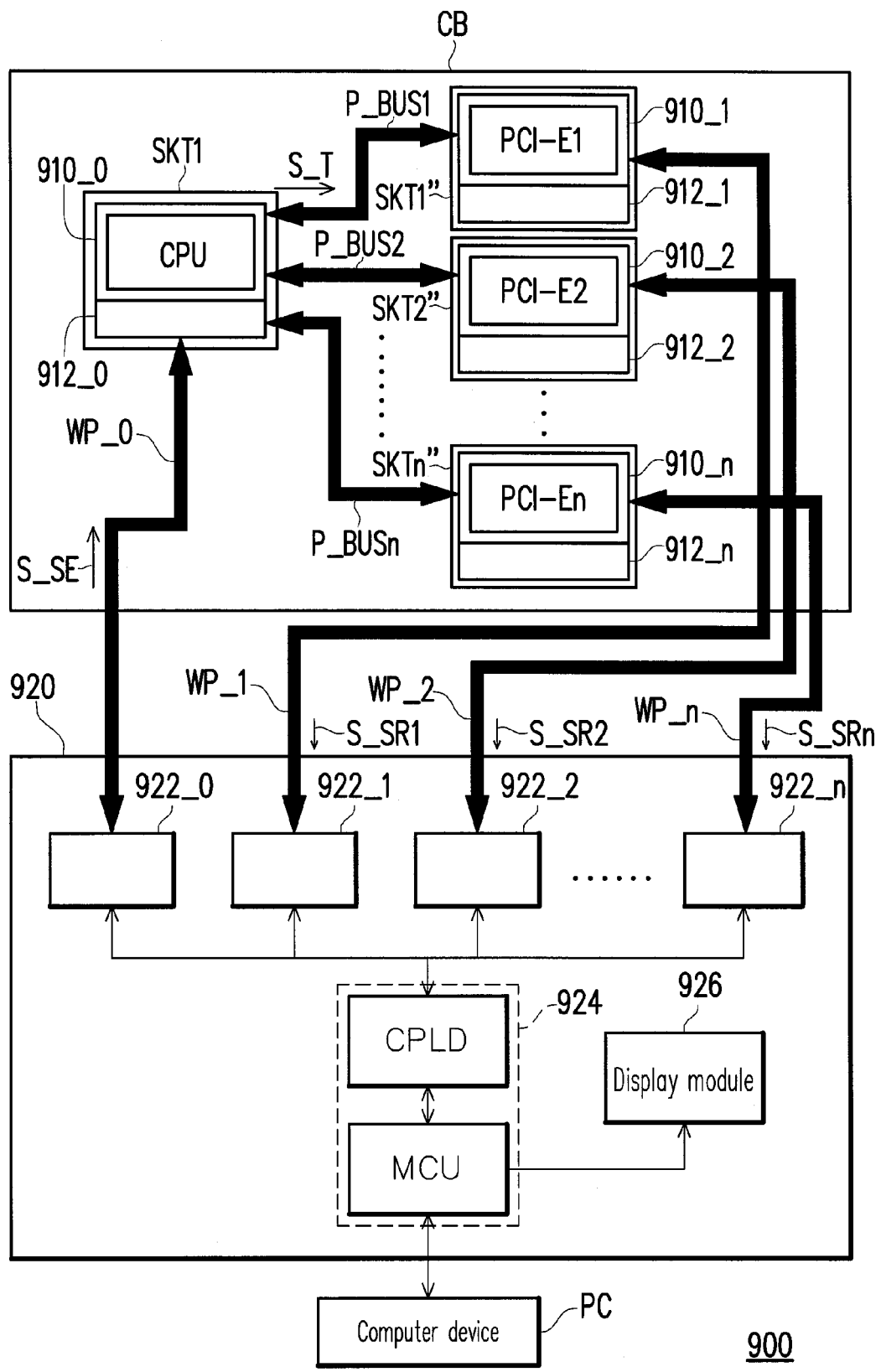
FIG. 9 is a schematic view illustrating a process of testing signal transmission status through buses between CPU and PCI-E devices according to an embodiment of the invention.

FIG. 8 is a flowchart illustrating a process of testing signal transmission status through buses between CPU and PCI-E devices according to an embodiment of the invention. FIG. 9 is a schematic view illustrating a process of testing signal transmission status through buses between CPU and PCI-E devices according to an embodiment of the invention.

With reference to FIG. 9, the testing apparatus 900 includes device transfer plates 910_1 to 910_n and a testing circuit 920. The device transfer plates 910_1 to 910_n respectively include the corresponding second serial connectors 912_0 to 912_n, and the testing circuit 920 includes first serial connectors 922_0 to 922_n, a processing unit 924, and, a display module 926. Here, a signal is transmitted between the CPU and the PCI-E devices (each of the PCI-E devices is named as PCI-E1 to PCI-En below) through corresponding buses P_BUS1 to P_BUSn, respectively. The functions of other components in the device transfer plates 910_0 to 910_n and the testing circuit 920 may be referred to as those described in the previous embodiments and thus will not be further described hereinafter.

In the present embodiment, the device transfer plates 910_0 to 910_n are electrically connected to the to-be-tested CPU and PCI-E1 to PCI-En, respectively, and the device transfer plate 910_0 to 910_n is respectively inserted into the corresponding sockets SKT1 and SKT1'' to SKTn'' on the circuit board CB, such that the to-be-tested CPU and PCI-E1 to PCI-En are electrically connected through the corresponding buses P_BUS1 to P_BUSn and the corresponding route wires on the circuit board CB.

Steps S400 to S404 shown in FIG. 8 are the same as those described in the embodiment shown in FIG. 4, and therefore no relevant description is further provided herein. With reference to FIG. 8 and FIG. 9, after the processing unit 924 performs the step S404, the processing unit 924 determines the buses corresponding to the to-be-tested electronic devices are the buses P_BUS1 to P_BUSn between CPU and PCI-E devices (i.e., the PCI-E buses) according to the identification codes read by the processing unit 924.

According to the specifications of PCI-E buses in the present embodiment, there are capacitors on the transmission channels of the PCI-E buses, and therefore direct-current testing signals cannot be properly transmitted through the PCI-E buses. When the processing unit 924 determines that the to-be-tested buses are PCI-E buses, the processing unit 924 provides a corresponding serial signal S_SE to the device transfer plate 910_0 corresponding to the CPU (step 806), such that the device transfer plate 910_0 provides a testing signal S_T according to the serial signal S_SE (step S808).

Here, the testing signal S_T is a pulse signal and is transmitted through the buses P_BUS1 to P_BUSn between CPU and PC1-E1 to PCI-En.

The device transfer plates 910_1 to 910_n corresponding to PCI-E1 to PCI-En that receive the testing signal S_T respectively generate corresponding testing result signals S_SR1 to S_SRn according to the transmission state of the testing signal S_T through the corresponding buses P_BUS1 to P_BUSn (step S610).

Specifically, in step S610, each of the device transfer plates 910_1 to 910_n calculates a pulse number of the received testing signal (step S810) and compares a calculation result of the device transfer plates 910_1 to 910_n with the pulse number of the testing signal S_T provided by the device transfer plate 910_0 to generate the testing result signals S_SR1 to S_SRn (step S812). Through the comparison of the pulse number of the signal transmitted through and received by the buses, the testing result signals S_SR1 to S_SRn generated by the device transfer plates 910_1 to 910_n are not affected by the capacitors on the transmission channels.

After the device transfer plates 910_1 to 910_n respectively generate the corresponding testing result signals S_SR1 to S_SRn, the processing unit 924 sequentially receives the testing result signals S_SR1 to S_SRn from the device transfer plates 910_1 to 910_n through the corresponding serial signal wire pairs WP_1 to WP_n (step S814) and thereby determines whether the open circuit is occurred to each transmission channel of the corresponding buses P_BUS1 to P_BUSn (step S816).

Namely, the test on the transmission through the buses between CPU and PCI-E devices is substantially the same as the test on the transmission through the buses between CPU and DIMMs. The difference there between merely lies in that the testing result signals transmitted through the buses between CPU and PCI-E devices are generated by calculating the pulse number of the testing signals at the transmission end and the reception end and comparing the calculated pulse number. Here, the testing signals are pulse signals.

However, the testing signals in form of pulse signals and steps S810 and S812 performed for generating the testing result signal may also be applied for testing the buses between CPUs and the buses between CPU and DIMMs, which should not be construed as a limitation to the invention.

Besides, when the testing signal is the pulse signal, an inspector may, according to actual test considerations, adjust the frequency and the pulse number of the testing signal through setting the processing unit. For instance, the inspector may control the number of testing the bus by adjusting the frequency of the testing signal and the pulse number of the testing signal within a certain period (e.g., one testing result signal is generated corresponding to one pulse of the testing signal). Hence, using the testing apparatus described herein may help improve the flexibility in the test and increase the efficiency of the test.

The aforesaid embodiments may be individually implemented; however, in an alternative embodiment, the inspector may electrically connect the testing circuit to all or some of the device transfer plates corresponding to CPUs, DIMMs, and PCI-E devices through the corresponding serial signal wire pairs for conducting the test, and the invention is not limited thereto.

To sum up, a testing apparatus and a testing method of an electronic device are provided in an embodiment of the invention. The testing apparatus may test whether an open circuit is occurred to the bus between the to-be-tested electronic devices through the serial signal provided by the corresponding serial signal wire pair. Since it is not necessary to connect each transmission channel of the bus with the corresponding wire for testing the electronic device, the testing scheme as a whole is simplified, and the accuracy of the testing apparatus described herein is effectively ameliorated. Moreover, when the testing apparatus is applied, an inspector may perform the test on the bus between the electronic devices according to the testing signal of which the frequency and the pulse number are adjustable. Accordingly, using the testing apparatus described herein effectively improves the flexibility in the test and increases the efficiency of the test.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A testing apparatus configured to test a bus between at least two electronic devices on a circuit board, the circuit board comprising at least two sockets, the electronic devices being configured to electrically connect the corresponding sockets on the circuit board, respectively, the testing apparatus comprising:
   at least two device transfer plates electrically connected to the electronic devices corresponding to the device transfer plates and electrically connected to the sockets corresponding to the electronic devices; and
   a testing circuit electrically connected to the device transfer plates respectively through at least two sets of serial signal wire pairs, wherein the testing circuit, according to types of the electronic devices, provides a serial signal to one of the device transfer plates through the corresponding serial signal wire pair and receives a response from another one of the device transfer plates through the corresponding serial signal wire pair, so as to test whether an open circuit is occurred to the bus between the electronic devices respectively corresponding to the device transfer plates,
   wherein the serial signal wire pairs and the device transfer plates are connected in one-to-one correspondence.

2. The testing apparatus as recited in claim 1, wherein the electronic devices comprise at least two first electronic devices, a signal is transmitted between the first electronic devices through a corresponding first bus having a plurality of transmission channels, the testing circuit provides the serial signal to the one of the device transfer plates, such that the another one of the device transfer plates responds to a signal transmission state of the corresponding first bus and outputs a testing result signal to the testing circuit through the corresponding serial signal wire pair, and the testing circuit according to the testing result signal determines whether the open circuit is occurred to each of the transmission channels of the corresponding first bus.

3. The testing apparatus as recited in claim 2, wherein the testing circuit further determines whether a short circuit is occurred between adjacent transmission channels of the transmission channels of the corresponding first bus according to the testing result signal.

4. The testing apparatus as recited in claim 1, wherein the electronic devices comprise a first electronic device and at least one second electronic device, a signal is transmitted between the first electronic device and the at least one second electronic device through a corresponding second bus having a plurality of transmission channels, the testing circuit provides the serial signal to the device transfer plate corresponding to the first electronic device, such that the device transfer plates corresponding to the at least one second electronic device responds to a signal transmission state of the corresponding second bus and outputs a testing result signal to the testing circuit through the corresponding serial signal wire pair, and the testing circuit according to the testing result signal determines whether the open circuit is occurred to each of the transmission channels of the corresponding second bus.

5. The testing apparatus as recited in claim 4, wherein the electronic devices comprise a first electronic device and at least one third electronic device, a signal is transmitted between the first electronic device and the at least one third electronic device through a corresponding third bus having a plurality of transmission channels, the testing circuit provides the serial signal to the device transfer plates corresponding to the first electronic device, such that the device transfer plate corresponding to the at least one third electronic device responds to a signal transmission state of the corresponding third bus and outputs a testing result signal to the testing circuit through the corresponding serial signal wire pair, and the testing circuit according to the testing result signal determines whether the open circuit is occurred to each of the transmission channels of the corresponding third bus.

6. The testing apparatus as recited in claim 1, wherein the testing circuit comprises:
at least two first serial connectors;
a processing unit electrically connected to the first serial connectors for generating the serial signal according to the types of the electronic devices, so as to control signal transmission and signal reception of the device transfer plates; and
a display module electrically connected to the processing unit for displaying a testing result of the electronic devices.

7. The testing apparatus as recited in claim 6, wherein each of the device transfer plates has an identification code, the processing unit reads the identification codes to determine the types and a testing order of the electronic devices to be tested, and the processing unit accordingly provides the corresponding serial signal and decides the testing order.

8. The testing apparatus as recited in claim 6, wherein each of the device transfer plates comprises:
a second serial connector, wherein the second serial connectors of the device transfer plates are electrically connected to the first serial connectors corresponding to the second serial connectors through the corresponding serial signal wire pairs, respectively;
a first control module electrically connected to the second serial connector to receive the serial signal;
a transmission module electrically connected to the first control module and controlled by the first control module to provide a testing signal, such that the corresponding electronic device transmits the testing signal through the corresponding bus; and
a reception module electrically connected to the first control module, the reception module receiving the testing signal transmitted through the corresponding bus and transmitting the testing signal back to the first control module, such that the first control module generates a testing result signal.

9. The testing apparatus as recited in claim 8, wherein the testing signal is a pulse signal, and the first control module sets a frequency and a pulse number of the testing signal according to the serial signal.

10. The testing apparatus as recited in claim 9, wherein the reception module calculates the pulse number of the received testing signal and transmits a calculation result back to the first control module, and the first control module compares the calculation result with the pulse number of the testing signal provided by the corresponding device transfer plate to generate the testing result signal.

11. The testing apparatus as recited in claim 8, wherein the testing circuit further comprises:
a protocol analyzing module electrically connected to the first serial connectors and the processing unit for analyzing a signal output and received by the corresponding bus and transmitting an analysis result back to the processing unit.

12. The testing apparatus as recited in claim 11, wherein each of the device transfer plates further comprises:
a second control module electrically connected to the transmission module, the reception module, and the second serial connector for obtaining the signal output and received by the corresponding bus and transmitting the signal to the protocol analyzing module through the second serial connector.

13. A testing method of an electronic device for testing a bus between at least two electronic devices on a circuit board, the circuit board comprising at least two sockets, the electronic devices being configured to electrically connect the corresponding sockets on the circuit board, respectively, the testing method comprising:
electrically connecting at least two device transfer plates to the electronic devices corresponding to the device transfer plates and electrically connecting the device transfer plates to the sockets corresponding to the electronic devices, respectively;
electrically connecting the device transfer plates to at least two serial signal wire pairs, wherein the serial signal wire pairs and the device transfer plates are connected in one-to-one correspondence; and
providing a serial signal to one of the device transfer plates through the corresponding serial signal wire pair and receiving a response from another one of the device transfer plates through the corresponding serial signal wire pair according to types of the electronic devices, so as to test whether an open circuit is occurred to the bus between the electronic devices respectively corresponding to the device transfer plates.

14. The testing method as recited in claim 13, wherein the electronic devices comprise at least two first electronic devices, a signal is transmitted between the first electronic devices through a corresponding first bus having a plurality of transmission channels, and the step of testing whether the open circuit is occurred to the bus between the electronic devices respectively corresponding to the device transfer plates comprises:
providing the serial signal to the one of the device transfer plates;
receiving a testing result signal from the another one of the device transfer plates through the corresponding serial signal wire pair, wherein the testing result signal is associated with a signal transmission state of the corresponding first bus; and
determining whether the open circuit is occurred to each of the transmission channels of the corresponding first bus according to the testing result signal.

15. The testing method as recited in claim 14, wherein the step of testing whether the open circuit is occurred to the bus between the electronic devices respectively corresponding to the device transfer plates further comprises:
determining whether a short is occurred between adjacent transmission channels of the transmission channels of the corresponding first bus according to the testing result signal.

16. The testing method as recited in claim 13, wherein the electronic devices comprise a first electronic device and at least one second electronic device, a signal is transmitted between the first electronic device and the at least one second electronic device through a corresponding second bus having a plurality of transmission channels, and the step of testing whether the open circuit is occurred to the bus between the electronic devices respectively corresponding to the device transfer plates comprises:
  providing the serial signal to the device transfer plates corresponding to the first electronic device;
  receiving a testing result signal from the device transfer plate corresponding to the at least one second electronic device through the corresponding serial signal wire pair, wherein the testing result signal is associated with a signal transmission state of the corresponding second bus; and
  determining whether the open circuit is occurred to each of the transmission channels of the corresponding second bus according to the testing result signal.

17. The testing method as recited in claim 16, wherein the electronic devices comprise a first electronic device and at least one third electronic device, a signal is transmitted between the first electronic device and the at least one third electronic device through a corresponding third bus having a plurality of transmission channels, and the step of testing whether the open circuit is occurred to the bus between the electronic devices respectively corresponding to the device transfer plates comprises:
  providing the serial signal to the device transfer plates corresponding to the first electronic device;
  receiving a testing result signal from the device transfer plate corresponding to the at least one third electronic device through the corresponding serial signal wire pair, wherein the testing result signal is associated with a signal transmission state of the corresponding third bus; and
  determining whether the open circuit is occurred to each of the transmission channels of the corresponding third bus according to the testing result signal.

18. The testing method as recited in claim 13, further comprising:
  setting an identification code on each of the device transfer plates.

19. The testing method as recited in claim 18, wherein, before the step of providing the serial signal, the testing method further comprises:
  reading the identification codes to determine the types and a testing order of the electronic devices to be tested.

20. The testing method as recited in claim 13, wherein the step of testing whether the open is occurred to the bus between the electronic devices respectively corresponding to the device transfer plates comprises:
  providing a testing signal according to the serial signal, wherein the testing signal is transmitted through the bus between the electronic devices respectively corresponding to the one and the another one of the device transfer plates; and
  generating a testing result signal according to a transmission state of the testing signal through the bus.

21. The testing method as recited in claim 20, wherein the testing signal is a pulse signal, and the step of generating the testing result signal according to the transmission state of the testing signal through the bus comprises:
  calculating a pulse number of the received testing signal; and
  comparing a calculation result with the pulse number of the testing signal provided by the corresponding device transfer plate to generate the testing result signal.

22. The testing method as recited in claim 13, further comprising:
  obtaining a signal output and received by the corresponding bus;
  analyzing the obtained signal; and
  transmitting an analysis result back.

* * * * *